(12) United States Patent
Kim et al.

(10) Patent No.: US 6,316,349 B1
(45) Date of Patent: Nov. 13, 2001

(54) METHOD FOR FORMING CONTACTS OF SEMICONDUCTOR DEVICES

(75) Inventors: Jeong Ho Kim; Jae Ok Ryu; Ja Chun Ku, all of Ichon-shi; Jin Woong Kim, Seoul; Si Bum Kim, Seoul; Su Jin Oh, Seoul, all of (KR)

(73) Assignee: Hyundai Electronics industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/438,048

(22) Filed: Nov. 10, 1999

(30) Foreign Application Priority Data

Nov. 12, 1998 (KR) .................................. 98-48340
Jun. 11, 1999 (KR) .................................. 99-21770
Aug. 31, 1999 (KR) .................................. 99-36608

(51) Int. Cl.[7] .............................................. H01L 21/4763
(52) U.S. Cl. ........................... 438/637; 438/702; 257/401
(58) Field of Search ................................. 438/637, 638, 438/639, 640, 672, 673, 428; 257/401

(56) References Cited

U.S. PATENT DOCUMENTS 4,888,297    12/1989    Aboelfotoh et al. .
5,480,814    1/1996    Wuu et al. .
5,622,596 *  4/1997    Armacost et al. .................... 438/702
5,897,372 *  4/1999    Howard ................................ 438/637
6,057,581 *  5/2000    Doan .................................... 257/401

* cited by examiner

Primary Examiner—David Nelms
Assistant Examiner—Dung A Le
(74) Attorney, Agent, or Firm—Jacobson Holman, PLLC (57) ABSTRACT

Disclosed is a method for forming contacts of a semiconductor device. In accordance with the invention, an oxidized silicon-rich nitride film is used as an etch barrier film for a self-aligned contact (SAC) process. Accordingly, the oxidized silicon-rich nitride film exhibits less stress, as compared to an LPCVD nitride film, thereby being capable of avoiding a degradation in the characteristics of the devices finally produced or distortion of the wafer used. There is no formation of cracks occurring in the nitride film during a subsequent thermal process. It is also unnecessary to conduct an additional reflection preventing process. Accordingly, the entire process is simplified. It is also possible to improve a decrease in the operating speed of the devices due to a parasitic capacitance existing among conductive lines because the oxidized silicon-rich nitride film has a low dielectric constant, as compared to nitride films. No damage occurs in the oxidized silicon-rich nitride film, so that it is possible to prevent the substrate from being damaged.

17 Claims, 7 Drawing Sheets

METHOD FOR FORMING CONTACTS OF SEMICONDUCTOR DEVICES

BACKGROUND OF THE INVENTION

1. Field of the Invention

The present invention relates to a method for fabricating semiconductor devices, and more particularly to a method for forming contacts of semiconductor devices, in which an oxidized silicon-rich nitride film is used as an etch barrier film in a self-aligned contact (SAC) process conducted using the etch barrier film, thereby being capable of avoiding a degradation in the quality of devices finally produced due to a short circuit of conductive lines, an etching stop caused by a reduced process margin, and stress occurring during the SAC process, so as to achieve an improvement in a yield process and an improved reliability in the operation of the devices.

2. Description of the Prior Art

The recent trend to fabricate highly integrated semiconductor devices has been greatly affected by the development of techniques of forming patterns having a micro dimension. In other words, in order to fabricate highly integrated semiconductor devices, it is necessary to form photoresist film patterns having a micro dimension. Such photoresist film patterns are widely used as masks for carrying out an etch process or ion implantation process in the fabrication of semiconductor devices.

Although the resolution of such a photoresist film pattern is greatly affected by the material of the photoresist film and the bondability of the photoresist film to a substrate, on which the photoresist film is formed, it is basically proportional to the wavelength of light emitted from a light source used in a stepper and a process constant used while being inversely proportional to the numerical aperture of the stepper. That is, the resolution can be expressed by the following equation:

$$R = k \times 8/NA$$

where, R represents a resolution, k represents a process constant, 8 represents the wavelength of light emitted from a light source used in a stepper, and NA represents the numerical aperture of the stepper.

In order to obtain an improvement in the resolution of the stepper, it is necessary to use a light source having a reduced wavelength. For example, G-line steppers using a wavelength of 436 nm and i-line steppers using a wavelength of 365 nm are limited in terms of resolution to about 0.7 m and about 0.5 m for line/space patterns. In order to form micro patterns having a dimension of less than 0.5 m, it is necessary to use a stepper using a light source having a wavelength shorter than those of G or i-line steppers. Such a light source may be a deep ultraviolet (DUV) source such as a KrF laser having a wavelength of 248 nm or an ArF laser having a wavelength of 193 nm.

In addition to attempts to improve steppers as mentioned above, improvements in processes have also been made in order to improve a limitation in resolution. For example, an use of a phase shift mask as a photo mask has been proposed. In addition, a contrast enhancement layer (CEL) method has been developed in which a separate thin film capable of achieving an improvement in an image contrast is formed on a wafer. A tri-layer resister (TLR) method has also been proposed in which an intermediate layer made of, for example, spin on glass (SOG), is interposed between two photoresist films. Also, a silation method has been proposed in which silicon is selectively implanted in an upper portion of a photoresist film.

Meanwhile, contact holes, which are adapted to connect upper and lower conductive lines to each other, exhibit a high design rule, as compared to line/space patterns. For an increased integration degree of semiconductor devices, such contact holes have a reduced size and a reduced space from peripheral lines. Furthermore, an increase in an aspect ratio is involved. The aspect ratio represents the depth-to-diameter ratio of a contact hole.

For this reason, where a highly integrated semiconductor device having a multi-layer conductive line structure is to be fabricated, an accurate and strict alignment among masks is required in the fabrication of the semiconductor device. This results in a reduction in a margin process.

Masks for the formation of such contact holes are formed, taking into consideration a misalignment tolerance involved in the process of aligning those masks with one another, a lens distortion involved in a light exposure process, a critical dimension variation involved in the process of forming those mask and conducting a photolithography, and a registration among those masks, in order to maintain a desired space between adjacent contact holes.

For such a contact hole formation method, there have been proposed a direct etch method, a method using side-wall spacers, and an SAC (self align contact) method.

The direct etch method and the method using side-wall spacers exhibit a limitation involved in the fabrication of highly integrated semiconductor devices because they cannot be applied to the fabrication of semiconductor devices involving a design rule of 0.3 m or less in accordance with current techniques.

The SAC method has been proposed in order to overcome a limitation involved in a lithography used in the formation of contact holes. Known SAC methods are classified in accordance with an etch barrier film used. For such an etch barrier film, a polysilicon film, a nitride film, and an oxidized nitride film. A preferred one is an SAC method using a nitride film as an etch barrier film.

Now, various examples of conventional methods for forming self-aligned contacts of semiconductor devices will be described in detail.

In accordance with one example of a conventional method for forming self-aligned contacts of semiconductor devices, a desired underlayer structure is formed on a semiconductor substrate. The underlayer structure may include a device isolation oxide film, and metal oxide semiconductor field effect transistors (MOSFETs) each including a gate electrode and a source/drain region overlapping with a gate oxide film and a mask oxide film pattern, respectively. Over the entire exposed upper surface of the resulting structure, an etch barrier film and an interlayer insulating film made of an oxide material are then sequentially formed.

Thereafter, a photoresist film pattern is formed on the resulting structure in order to expose portions of the interlayer insulating film corresponding to regions where contacts for charge storage electrodes and bit lines, etc. are to be formed, respectively.

The interlayer insulating film is then dry-etched at its exposed portions not covered with the photoresist film pattern, thereby causing the etch barrier film to be partially exposed. The etch barrier film is subsequently etched at its exposed portions, thereby forming contact holes.

Where the etch barrier film is made of polysilicon, the formation thereof may be carried out using a method, in which the etch barrier film is completely formed over the entire surface of the semiconductor substrate, or a method in which the etch barrier film is formed in the form of pads on portions of the semiconductor substrate corresponding to the contact hole forming regions, respectively.

Since polysilicon, which exhibits an etch mechanism different from that of oxide, is used to form the etch barrier film, it is possible to obtain a high etch selectivity difference with regard to the oxide films disposed therebeneath.

However, the poly barrier SAC formation method exhibits a degradation in reliability in regard to the insulation among contact holes. On the other hand, the pad formation method involves a damage of the silicon substrate occurring when the contact pads are misaligned from the silicon substrate.

In order to solve the above-mentioned problems, formation of spacers or expansion of contact pads has been proposed. However, these methods involve a problem in that they cannot realize a design rule of 0.18 m or less.

The SAC method using a nitride film as an etch barrier film (poly barrier SAC) is known as a method capable of solving the above mentioned problems.

In accordance with this SAC method, the interlayer insulating film is dry-etched under the condition in which the etch selectivity difference between the interlayer insulating film and the etch barrier film is 15:1 or more, thereby causing the nitride film to be partially exposed. The exposed portions of the nitride film are then removed, thereby forming contact holes.

In this case, the etch process is carried out using one or more of $C_2F_4$, $C_2F_6$, $C_3F_6$, $C_3F_8$, $C_4F_8$, $C_2H_2$, $CH_3F$, $CH_3F$, $CH_2HF$, and $CH_2F_2$, as C—H—F-based gas or hydrogen-containing gas producing a large amount of polymer, mixed with inert gas, in order to obtain an increased etch selectivity.

As a polymer produced during the etch process is deposited on the interlayer insulating film made of an oxide material, it is continuously removed by oxygen generated from the oxide film, so that the interlayer insulating film is etched. However, where the polymer is deposited on the nitride film, this nitride film is not damaged because there is no etch source.

Therefore, although an increase in the amount of polymer produced results in an increase in the etch selectivity difference between the oxide film and the nitride film, an excessive production of polymer or a production of a polymer containing non-etchable components may cause stopping of the etch process at a certain stage. When etching gas of an increased C/F ratio is used, an increased production of polymer occurs, thereby causing a easier stopping of the etch process.

On the other hand, where an excessively reduced etch selectivity difference between the oxide film and the nitride film, a damage of the nitride film may occur. In this case, the conductive layer, disposed beneath the nitride film, for example, the semiconductor substrate, may be damaged. A short circuit between upper and lower lines may also be generated. The above method also exhibits a limited process tolerance for optimum process conditions, a reduced reproducibility, and a degraded reliability resulting from stress applied to other layered films.

The method using an oxidized nitride film as an etch barrier film is a method proposed to solve the problems involved in the SAC method using a nitride film as an etch barrier film.

The oxidized nitride film serves to prevent an application of stress to layers disposed therebeneath and a damage of the interface thereof with a boro phospho silicate glass (BPSG) film.

However, this method involves a problem of having a difficulty in conducting a desired SAC process itself because oxide nitride exhibits medium properties between oxide and nitride, so it is difficult for the oxidized nitride film to have a desired high etch selectivity of, for example, 15:1 or more, to the oxide film.

Another conventional method for forming self-aligned contacts of semiconductor devices will be described hereinafter.

Figure 1:
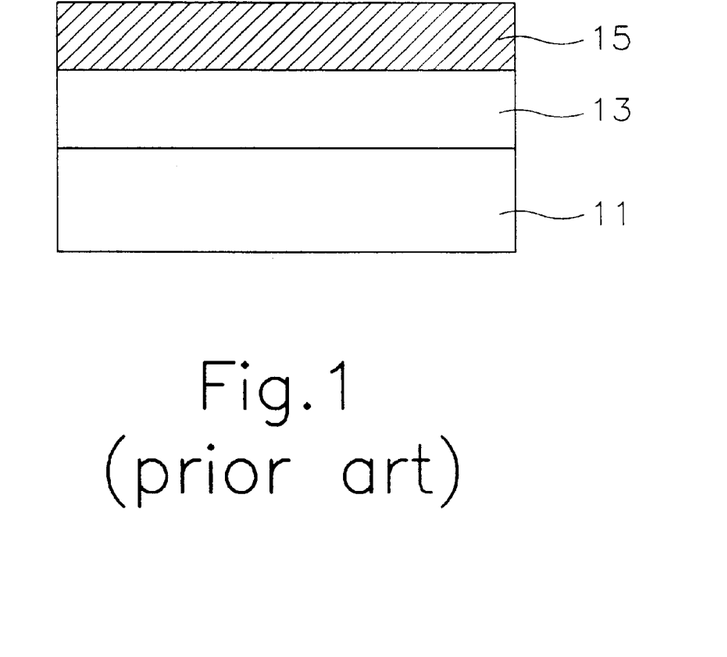
FIGS. 1 to 3 are cross-sectional views respectively illustrating a conventional method for forming self-aligned contacts of semiconductor devices.
Figure 2:
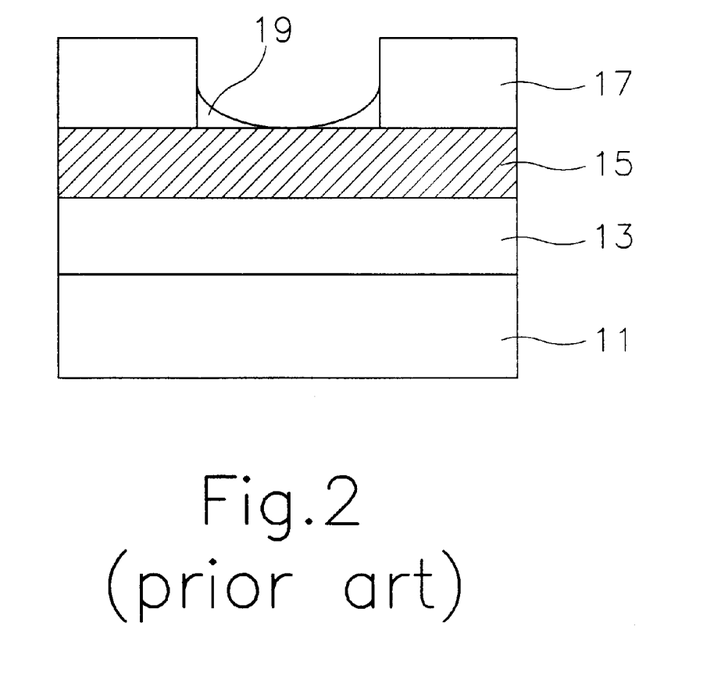
Figure 3:
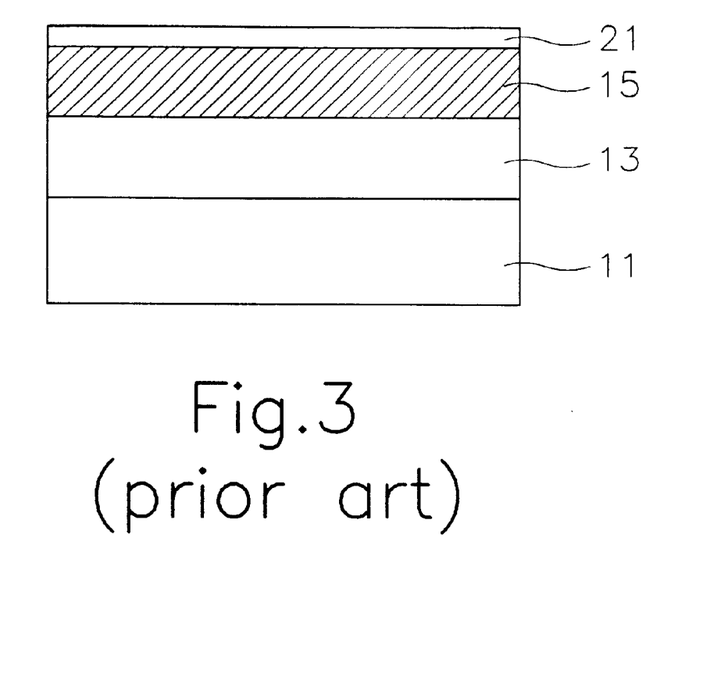

FIGS. 1 to 3 are cross-sectional views respectively illustrating a conventional method for forming self-aligned contacts of semiconductor devices.

In accordance with this conventional method, a conductive layer 11 is first formed over a semiconductor substrate (not shown) in order to form word lines, bit lines, or other metal lines on the semiconductor substrate, as shown in FIG. 1. An anti-reflection film and a hard mask 15 are then sequentially deposited over the conductive layer 11.

The anti-reflection film 13 is comprised of an oxidized silicon nitride film whereas the hard mask 15 is comprised of a nitride film formed using a plasma enhanced chemical vapor deposition (PECVD) process.

As shown in FIG. 2, a photoresist film pattern 17 for contacts is formed on the nitride film adapted to form the hard mask 15.

The photoresist film pattern 17 may be formed with scum. The formation of such scum results from amines produced due to a reaction of the photoresist film 17 with nitrogen generated from the nitride film at a subsequent process for forming the hard mask 15. This scum results in formation of photoresist film pattern tails 19 adversely affecting a subsequent formation of conductive lines.

An CN-SAC method using a capping nitride may be conducted prior to the formation of the photoresist film 17. This CN-SAC method may be effectively carried out by virtue of a high etch selectivity difference of the capping nitride from the oxide film.

However, this method involves a problem resulting from intrinsic stress of the nitride film. That is, it is impossible to reduce cracks formed during a process for forming conductive lines due to the intrinsic stress of the nitride film. Such cracks may cause a degradation in the characteristics of the conductive lines. For this reason, the final devices are adversely affected.

Prior to the formation of the photoresist film pattern 17 shown in FIG. 2, the nitride film deposited for the hard mask 15 is processed at its surface using plasma, thereby forming a silicon oxide film 21 thereon.

After forming a mask for conductive line contacts on the silicon oxide film 21, the oxide film 21, hard mask 15, anti-reflection film 13, and conductive layer 11 are etched using the mask, thereby patterning them.

Thereafter, nitride film spacers are formed on side walls of the pattern of the conductive layer 11 using a low pressure chemical vapor deposition (LPCVD) process.

The nitride film spacers advantageously exhibit a high step coverage. However, these nitride film spacers exhibit a low bonding force to the PECVD nitride film adapted to be used as the hard mask, so that they may be detached from the PECVD nitride film in a subsequent thermal process. In this case, an oxidation of the conductive layer 11 may occur.

As apparent from the above description, the conventional method for forming contacts of semiconductor devices involves various problems.

That is, since the anti-reflection film, hard mask, and insulating film spacers are different from one another in terms of materials used therefor or deposition methods therefore, the conventional method may involve a peel-off phenomenon occurring between interfaces of those films.

For this reason, unnecessary oxide films may be formed resulting in a degradation in the throughput, characteristics, and reliability of the final semiconductor devices.

Another conventional method for forming self-aligned contacts of semiconductor devices will be described hereinafter.

Figure 4:
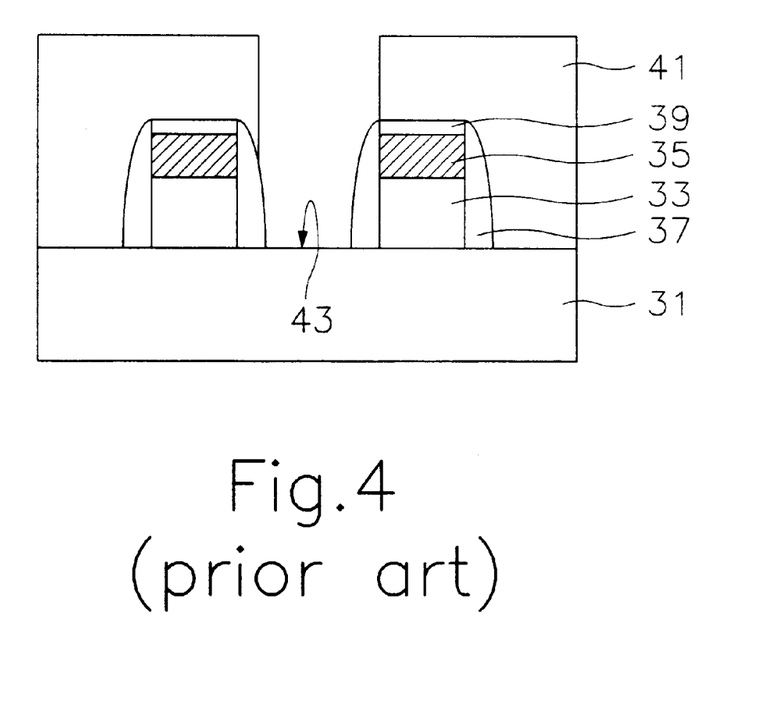
FIG. 4 is a cross-sectional view illustrating a conventional method for forming self-aligned contacts of semiconductor devices.

FIG. 4 is a cross-sectional view illustrating a conventional method for forming self-aligned contacts of semiconductor devices.

In accordance with this method, a conductive layer 33 for gate electrodes is first formed over a semiconductor substrate 31, as shown in FIG. 4. A first silicon nitride film 35 as a mask insulating film is then formed over the conductive layer 33.

Thereafter, an oxidized silicon nitride film 39 is formed as an anti-reflection film over the first silicon nitride film 35.

An etching process using a gate electrode mask is subsequently carried out. In this etching process, the oxidized silicon nitride film 39 as an anti-reflection film, the first silicon nitride film 35 as a mask insulating film, and the conductive layer 33 for gate electrodes are etched, thereby forming gate electrodes.

In the fabrication of highly integrated semiconductor devices as in this case, it is essentially necessary to use the anti-reflection film because the silicon nitride film adapted as a mask insulating film exhibits a severe diffused reflection.

A second silicon nitride film 37 is then formed on the side walls of the gate electrodes, thereby forming insulating film spacers on those side walls.

Subsequently, an interlayer insulating film 41 is formed to planarize the entire upper surface of the resulting structure. The interlayer insulating film 41 is made of an insulating material, exhibiting a fluidability, such as BPSG.

An SAC process is then conducted in which contact holes 43 allowing desired portions of the semiconductor substrate 31 to be exposed are formed.

In accordance with this conventional method, however, the wafer used may be subjected to a distortion resulting from high stress of the mask insulating film or the silicon nitride film used for insulating film spacers. Such a wafer distortion may cause a lifting phenomenon of the conductor.

As a result, there is also a problem, such as alignment between different layers, of difficulty in conducting a subsequent lithography process.

Furthermore, the silicon nitride film may degrade the characteristics of the final devices because it has a high parasitic capacitance around the conductor by virtue of its high dielectric constant.

Since the silicon nitride film also exhibits a severe diffused reflection, it essentially requires to use an anti-reflection film disposed thereover. Such a requirement results in a complexity of fabrication processes.

SUMMARY OF THE INVENTION

Therefore, the present invention has been made in view of the above-mentioned problems involved in the conventional methods, and a primary objective of the invention is to provide a method for forming contacts of semiconductor devices in which an oxidized silicon-rich nitride film is used as an etch barrier film in an SAC process, thereby obtaining a sufficient etch selectivity for etching an interlayer insulating film.

A secondary objective of the invention is to provide a method for forming contacts of semiconductor devices, which is capable of preventing etch stopping during an etch process while reducing stress.

A third objective of the invention is to provide a method for forming contacts of semiconductor devices, which is capable of preventing formation of cracks in a subsequent thermal process for a nitride film formed as an etch barrier film while reducing a parasitic capacitance existing among conductive lines, thereby achieving an improvement in the yield process and an improved reliability in the operation of the devices.

A fourth objective of the invention is to provide a method for forming contacts of semiconductor devices in which an oxidized silicon-rich nitride film is formed as an etch barrier film on both the upper surface and side walls of a conductive layer pattern using the same material, thereby preventing a peel-off phenomenon of the etch barrier film.

A fifth objective of the invention is to provide a method for forming contacts of semiconductor devices, which is capable of allowing a subsequent SAC process to be stably and easily conducted, thereby preventing a degradation in the characteristics of semiconductor devices finally produced.

A sixth objective of the invention is to provide a method for forming contacts of semiconductor devices in which a mask insulating film for a conductor and insulating film spacers are formed using a multilayer structure including an oxidized silicon nitride film and an oxidized silicon-rich nitride film, thereby being capable of achieving an improvement in the characteristics, reliability and throughput of semiconductor devices produced in accordance with an SAC process, so that the method is suitable for the fabrication of highly integrated semiconductor devices.

In accordance with one aspect, the present invention provides a method for forming contacts of a semiconductor device comprising the steps of: forming an etch barrier film comprised of an oxidized silicon-rich nitride film over a semiconductor substrate having a desired underlayer structure; forming an interlayer insulating film over the oxidized silicon-rich nitride film; forming a photoresist film pattern on the interlayer insulating film in such a fashion that the interlayer insulating film is exposed at portions thereof corresponding to regions where contact holes are to be formed, respectively; selectively removing the exposed portions of the interlayer insulating film in accordance with an etch process using C—H—F-based gas, thereby partially exposing the oxidized silicon-rich nitride film, and completely removing the photoresist film pattern; and removing exposed portions of the oxidized silicon-rich nitride film using the left interlayer insulating film as a mask, thereby forming self-aligned contacts.

In accordance with another aspect, the present invention provides a method for forming contacts of a semiconductor device comprising the steps of: laminating a conductive layer pattern and a hard mask insulating film pattern on a semiconductor substrate; forming an etch barrier film comprised of an oxidized silicon-rich nitride film over the entire upper surface of the resulting structure; forming an interlayer insulating film over the oxidized silicon-rich nitride film; forming a photoresist film pattern on the interlayer insulating film in such a fashion that the interlayer insulating film is exposed at portions thereof corresponding to regions where contact holes are to be formed, respectively; selectively removing the exposed portions of the interlayer insulating film in accordance with an etching process using C—H—F-based gas, thereby partially exposing the oxidized silicon-rich nitride film, and completely removing the photoresist film pattern; and removing exposed portions of the oxidized silicon-rich nitride film using the left interlayer insulating film as a mask, thereby forming self-aligned contacts.

In accordance with another aspect, the present invention provides a method for forming contacts of a semiconductor device comprising the steps of: forming a conductive layer over a semiconductor substrate, and forming, over the conductive layer, a hard mask comprised of a first oxidized silicon-rich nitride film containing amorphous or polycrystalline silicon in an amount of 5 to 30%; processing the first oxidized silicon-rich nitride film using plasma, thereby forming an oxide film over the first oxidized silicon-rich nitride film; patterning the hard mask and the conductive layer, thereby forming a hard mask pattern and conductive lines; and forming, on side walls of the hard mask pattern and side walls of the conductive lines, spacers comprised of a second oxidized silicon-rich nitride film containing amorphous or polycrystalline silicon in an amount of 5 to 30%.

In accordance with another aspect, the present invention provides a method for forming contacts of a semiconductor device comprising the steps of: sequentially laminating, over a semiconductor substrate, a conductive layer, a first oxidized silicon nitride film, and a first oxidized silicon-rich nitride film, and patterning them, thereby forming conductive lines; forming, on side walls of the conductive lines, spacers each having a laminated structure including a second oxidized silicon nitride film and a second oxidized silicon-rich nitride film, respectively; forming an interlayer insulating film over the entire upper surface of the resulting structure to planarize the upper surface of the resulting structure; and forming contact holes in a self-aligned fashion in accordance with a self-aligned contact etch process while exposing desired portions of the semiconductor substrate through the contact holes, respectively.

BRIEF DESCRIPTION OF THE DRAWINGS

Other objectives and aspects of the invention will become apparent from the following description of embodiments with reference to the accompanying drawings in which.

DESCRIPTION OF THE PREFERRED EMBODIMENTS

Figure 5:
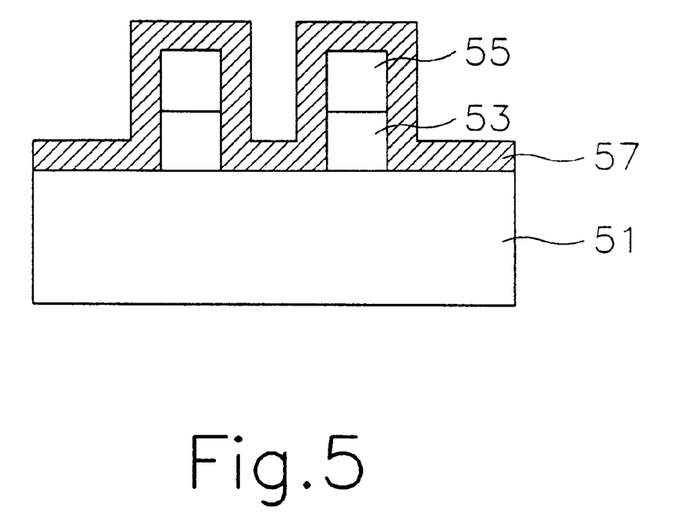
FIGS. 5 to 7 are cross-sectional views respectively illustrating sequential steps of a method for forming contacts of semiconductor devices in accordance with a first embodiment of the present invention.
Figure 6:
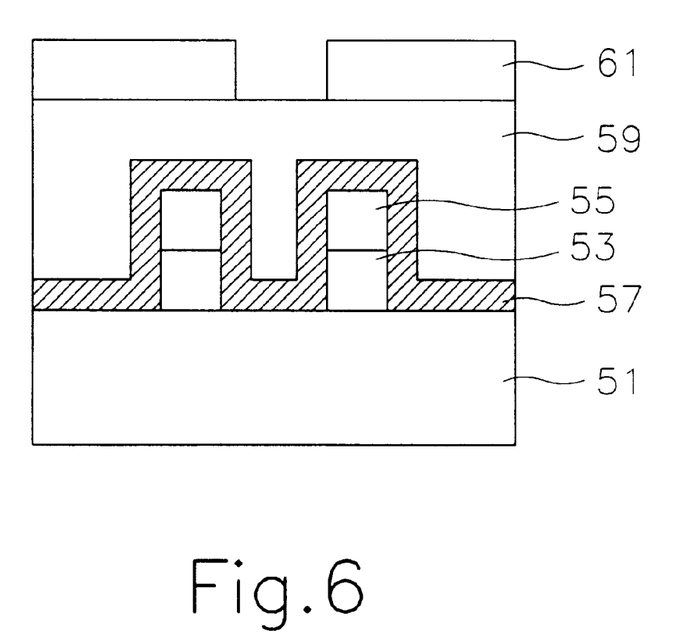
Figure 7:
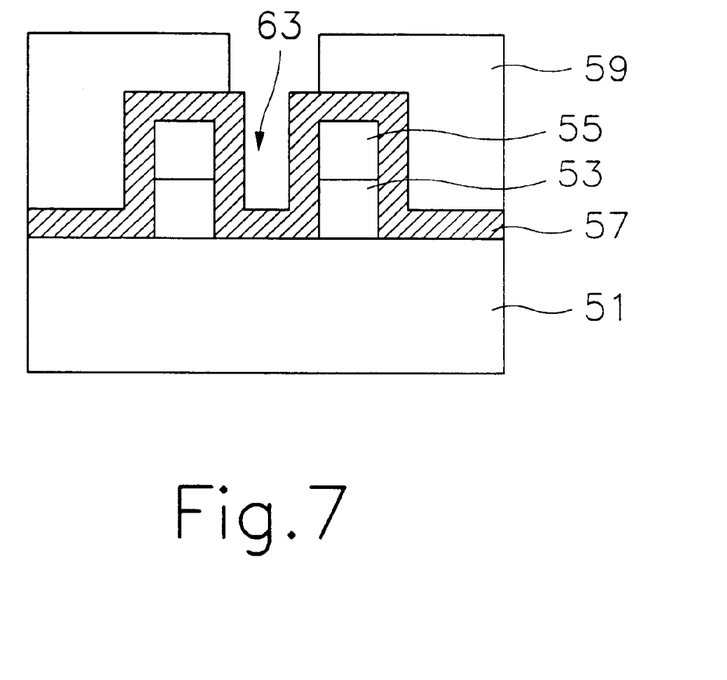

FIGS. 5 to 7 are cross-sectional views respectively illustrating sequential steps of a method for forming contacts of semiconductor devices in accordance with a first embodiment of the present invention. This embodiment is associated with SACs for charge storage electrodes.

Figure 8:
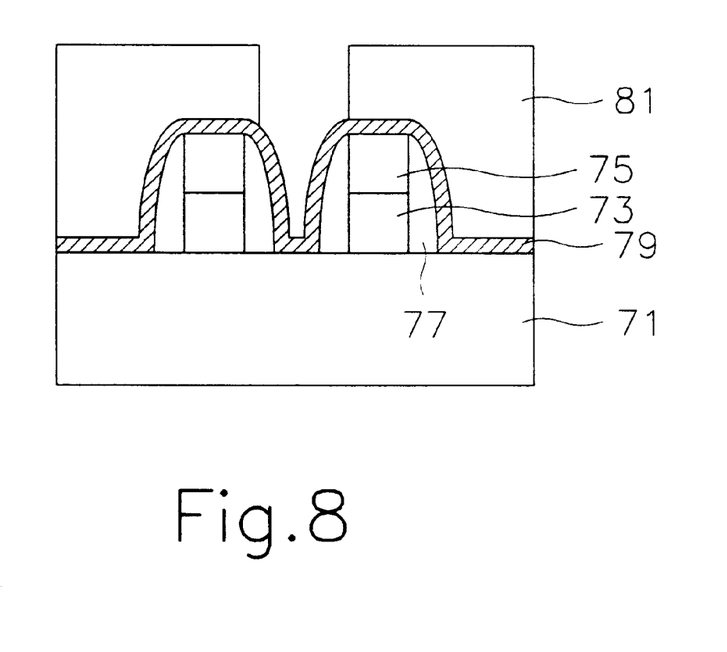
FIG. 8 is a cross-sectional view illustrating a method for forming contacts of semiconductor devices in accordance with a second embodiment of the present invention.

FIG. 8 is a cross-sectional view illustrating a method for forming contacts of semiconductor devices in accordance with a second embodiment of the present invention.

Figure 9:
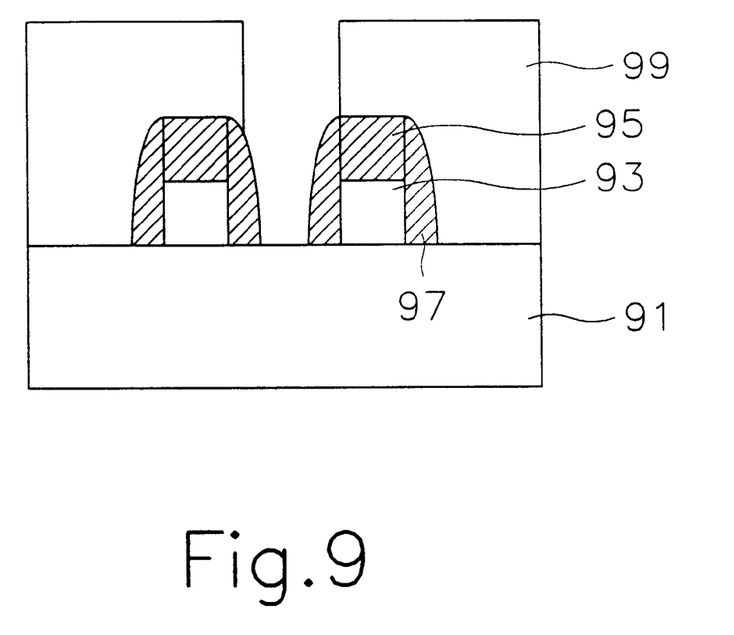
FIG. 9 is a cross-sectional view illustrating a method for forming contacts of semiconductor devices in accordance with a third embodiment of the present invention.

In addition, FIG. 9 is a cross-sectional view illustrating a method for forming contacts of semiconductor devices in accordance with a third embodiment of the present invention.

In accordance with the first embodiment of the present invention, MOSFETs are first formed on a silicon wafer. Each MOSFET includes a gate electrode 53 overlapping with a gate oxide film (not shown), a mask oxide film 33, and a source/drain region (not shown) having a lightly doped drain (LDD) structure. Over the entire upper surface of the resulting structure, an oxidized silicon-rich nitride film 57 is then formed, which serves as an etch barrier film during an etch process for forming contact holes.

The formation of the oxidized silicon-rich nitride film 57 is carried out using $SiH_4$ or $Si_2H_6$ as a silicon source thereof, $N_2O$ or $O_2$ as an oxygen source thereof, and $NH_3$ or $N_2$ as a nitrogen source thereof.

The ratio of the flow rates of gas components in the gas mixture, electric power, gas pressure, and substrate bias is controlled in accordance with the plasma generating principle and machine used. The oxidized silicon-rich nitride film 57 may be formed using a PECVD process or a high density plasma chemical vapor deposition (HDPCVD) process.

The PECVD process typically uses a capacitive coupled type plasma CVD machine whereas the HDPCVD process typically uses an inductive coupled plasma CVD machine.

Thereafter, an interlayer insulating film 59 is formed over the oxidized silicon-rich nitride film 57, as shown in FIG. 6. The interlayer insulating film 59 may be made of an oxide material such as BPSG or tetra ethyl ortho silicate (TEOS), or phospho silicate glass (PSG). A photoresist film pattern 61 is subsequently formed on the interlayer insulating film 59 in such a fashion that the interlayer insulating film 59 is exposed at its portion corresponding to regions of the semiconductor substrate 51 where charge storage electrode contacts are to be formed, respectively.

The interlayer insulating film 59 is then dry-etched at its exposed portions not covered with the photoresist film pattern 61, thereby forming contact holes 63 through where the oxidized silicon-rich nitride film 15 is exposed.

Since the oxidized silicon-rich nitride film 57 has not only Si—O bonds and Si—N bonds but also Si—Si bonds involving the use of an etch material different from those for the Si—O and Si—N bonds, it can obtain a sufficient etch selectivity with respect to the interlayer insulating film 59 made of an oxide material.

As a result, it can be found that the etch selectivity of the oxidized silicon nitride film 57 to the interlayer insulating film 59 varies depending on a variation in the content of Si in the oxidized silicon nitride film 57, as described in the following Table 1. When the content of Si is more than 70%, a leakage current is undesirably generated. Accordingly, the Si content of more than 70% is avoided.

TABLE 1

| Si Content (%) | Selectivity |
|---|---|
| 0 | 5 |
| 10 | 10 |
| 20 | 20 |
| 30 | 25 |
| 50 | 30 |
| 70 | 40 |

The etching condition for the interlayer insulating film 59 is determined, taking into consideration the factors described in the following Table 2.

The dry etching process for the interlayer insulating film 59 is conducted using C—H—F-based gas selected from the group consisting of $C_2F_4$, $C_2F_6$, $C_3F_6$, $C_3F_8$, $C_4F_8$, $C_4F_6$, $C_5F_8$, $C_4F_{10}$, $CH_3F$, $C_2HF_5$, $C_2H_2$, $CH_2F_2$, $C_xH_yF_z$ (x+y=2, 3,4,5; z=4,6,8,10) and mixtures thereof. The C—H—F-based gas is used alone or in a state mixed with inert gas such as Ar, He, Ne, Xe or $N_2$.

It is possible to obtain a maximum etch selectivity in accordance with a preferred embodiment of the present invention, based on the results of the experiments, in which electric power of 300 to 3,000 W, gas pressure of 3 to 200 mT, and a gas mixture of $C_4F_8:CH_2F_2:Ar=5\sim50:1\sim50:1\sim1,000$ are used for the interlayer insulating film 59 made of BPSG.

In association with process conditions, selectivity, etch stop possibility, and nitride film punchthrough possibility, an increase in the electric power, gas pressure, amounts of $C_4F_8$ and $CH_2F_2$, and amount of Ar results in an increase in etch selectivity while reducing the etch stop possibility and nitride film punchthrough possibility.

The oxidized silicon-rich nitride film 59 exhibits properties as described in the following Table 2.

TABLE 2

| Etch Barrier Film | Dielectric Constant | Stress | Selectivity |
|---|---|---|---|
| Oxidized Silicon-Rich Nitride Film | 5–6 | 1E8~3E9 dyne/cm$^2$: Compressive to Tensile | 20~25 |
| Nitride Film | 8 | ~1E10 dyne/cm$^2$: Tensile | 25 |

Now, the second and third embodiments of the present invention will be described in conjunction with FIGS. 8 and 9, respectively.

FIG. 8 illustrates a semiconductor device fabricated in accordance with the second embodiment of the present invention.

FIG. 9 illustrates a semiconductor device fabricated in accordance with the third embodiment of the present invention.

In accordance with the second embodiment of the present invention, an oxidized silicon-rich nitride film is used for an etch barrier film, as in the first embodiment. In this case, however, oxide film spacers 77 are formed on respective side walls of the gate electrodes 73 and mask oxide film pattern 75, as shown in FIG. 8.

On the other hand, in accordance with the third embodiment of the present invention illustrated in FIG. 9, spacers 97 are formed using an oxidized silicon-rich nitride film. In this case, an oxidized silicon-rich nitride film 95 is formed in place of the mask oxide film according to the first embodiment.

As apparent from the above description, the contact forming method according to one of the first through third embodiments of the present invention provides various effects.

That is, since the etch barrier film for the SAC process is formed using an oxidized silicon-rich nitride film, and a mixture of C—H—F-based gases is used in a process for etching the interlayer insulating film, thereby obtaining an etch selectivity of the interlayer insulating film to the etch barrier film, the oxidized silicon-rich nitride film exhibits less stress, as compared to an LPCVD nitride film used in conventional methods. Accordingly, it is possible to avoid a degradation in the characteristics of the devices finally produced or distortion of the wafer used.

It is also possible to solve formation of cracks occurring in the nitride film during a subsequent thermal process. Since the oxidized silicon-rich nitride film, which typically serves as an anti-reflection film, is used, it is unnecessary to conduct an additional reflection preventing process. Accordingly, the entire process is simplified.

It is also possible to improve a decrease in the operating speed of the devices due to a parasitic capacitance existing among conductive lines because the oxidized silicon-rich nitride film has a low dielectric constant, as compared to nitride films.

In addition, no damage occurs in the oxidized silicon-rich nitride film. Accordingly, it is possible to prevent the substrate from being damaged. An increased process margin for optimum process conditions and an increased etch uniformity are also obtained. Therefore, it is possible to achieve an improvement in the process yield and an improved reliability in the operation of the devices.

Figure 10:
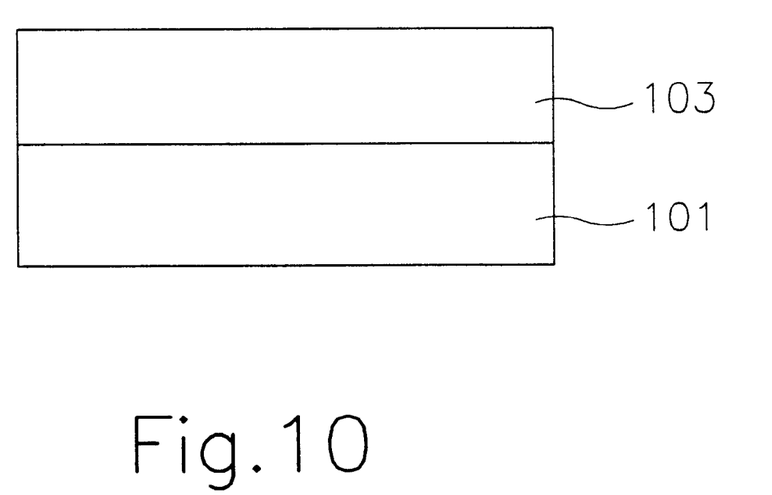
FIGS. 10 to 12 are cross-sectional views respectively illustrating a method for forming contacts of semiconductor devices in accordance with a fourth embodiment of the present invention.
Figure 11:
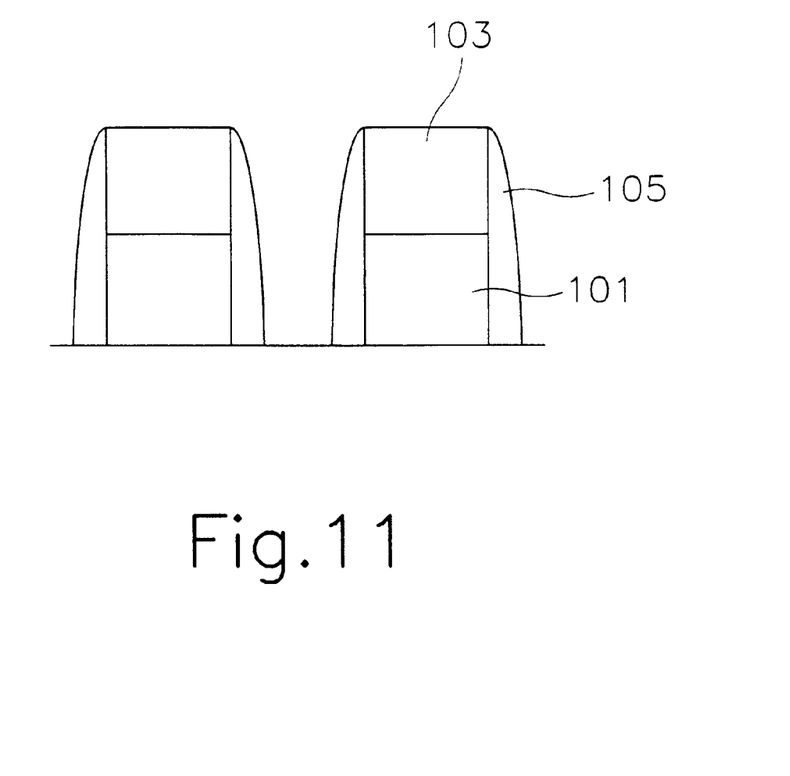
Figure 12:
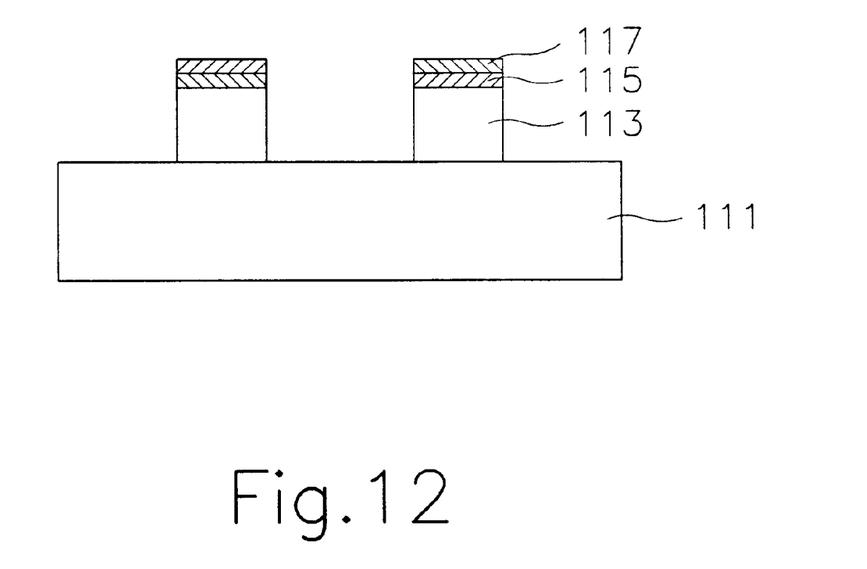

FIGS. 10 to 12 are cross-sectional views respectively illustrating a method for forming contacts of semiconductor devices in accordance with a fourth embodiment of the present invention.

The method according to the fourth embodiment of the present invention has the following principle.

That is, in accordance with the fourth embodiment of the present invention, a process for depositing an anti-reflection film, a film for a hard mask, and insulating film spacers to form conductive lines using the SAC process is conducted in a sequential fashion while maintaining the intrinsic characteristics and functions of those thin films. For these films, oxidized silicon-rich nitride films are formed using the same material in such a fashion that they subsequently form a single-layer structure.

The anti-reflection film should have an index of refraction ranging between the index of refraction of the conductive lines and the index of refraction of a photoresist film used, taking into consideration the fact that the conductive lines exhibit a high reflection factor.

Accordingly, the index range of reflection of the anti-reflection film should be wide. The anti-reflection film should also have an intrinsic function not degrading the characteristics of a semiconductor device to which it is applied.

The hard mask should exhibit a high etch selectivity to the interlayer insulating film which is an oxide film, as in the conventional methods using nitride films. The hard mask should also serve as an anti-oxidation film for conductive line materials to maintain film characteristics capable of preventing degradation in the characteristics of the device.

In accordance with the above mentioned principle of the present invention, factors used for the formation of the oxidized silicon-rich nitride films, such as the mixing ratio of the deposition gas mixture, plasma exciting power, substrate temperature, and reaction gas pressure, are controlled using a PECVD machine, thereby enabling formation of oxidized silicon-rich nitride films, each having specific contents of amorphous or polycrystalline silicon, silicon nitride, and silicon oxide.

Each oxidized silicon-rich nitride film used in the present invention has a content of amorphous or polycrystalline silicon ranging from 5% to 30%, and a content of silicon nitride ranging from 30% to 70%. The oxidized silicon-rich nitride film also has values of n and k allowing it to be used as an anti-reflection film (where, "n" represents an index of refraction, and "k" represents an absorption constant).

The oxidized silicon-rich nitride films, which exhibit the same optical characteristics and intrinsic functions associated with the processes used, are formed at different processing steps so as to have functions of the anti-reflection film and hard mask, respectively. For these oxidized silicon-rich nitride films, an in-situ plasma process may be conducted in the same chamber in order to remove scum from those films. Accordingly, a high process efficiency is obtained.

The spacers are formed using an oxidized silicon-rich nitride film made of the same material as that of the hard mask. Accordingly, it is possible to obtain improved bonding characteristics between those two films, thereby preventing a peel-off phenomenon from occurring between the films during a subsequent thermal process. Thus, an improved stability of the devices is achieved.

It is also possible to control the stress of the oxidized silicon-rich nitride film using the PECVD method. An insufficient step coverage resulting from the use of the PECVD method, as compared to that in the case using the LPCVD method, can be advantageously utilized upon forming a pattern having a small line space in a process for depositing spacers.

Now, the formation of contacts according to the fourth embodiment of the present invention involving the above-mentioned conditions will be described in conjunction with FIG. 10.

As shown in FIG. 10, a conductive layer 101 is first formed over a semiconductor substrate (not shown). A first oxidized silicon-rich nitride film 103 having a single-layer structure is then formed over the conductive layer 101. The first oxidized silicon-rich nitride film 103 serves as both the anti-reflection film and the hard mask.

The deposition of the first oxidized silicon-rich nitride film 103 is conducted in a reaction chamber under the condition using a reaction chamber pressure of 0.1 to 10 Torr, a radio-frequency application power of 10 to 1,000 KW, a substrate temperature of 100 to 500° C., and an electrode space of 100 to 1,000 mils while controlling the ratio of reaction gases used.

The formation of the first oxidized silicon-rich nitride film 103 is also carried out in such a fashion that the content of amorphous or polycrystalline silicon in the first oxidized silicon-rich nitride film 103 ranges from 5% to 30%, so that the first oxidized silicon-rich nitride film 103 exhibits an etch selectivity greatly different from that of the oxide film used as the interlayer insulating film.

In this case, the first oxidized silicon-rich nitride film 103 is formed in accordance with an in-situ process so that it exhibits a low silicon content at its lower portion and a high silicon content at its upper portion while still maintaining the total content of amorphous or polycrystalline silicon ranging from 5% to 30%. Accordingly, the first oxidized silicon-rich nitride film 103 can be used as a hard mask capable of improving the etch efficiency of an etch process subsequently conducted.

At the lower portion thereof having a low silicon content, the first oxidized silicon-rich nitride film 103, which contains silicon, silicon nitride ($Si_3N_4$), and silicon oxide ($SiO_2$), also has an Si—N ($Si_3N_4$) content ranging from 30% to 70% in order to reduce the Si—O ($SiO_2$) content thereof. Accordingly, the first oxidized silicon-rich nitride film 103 exhibits a high etch selectivity greatly different from that of the interlayer insulating film subsequently formed using an oxide film.

The resulting structure is then processed using plasma in an in-situ fashion in the same chamber, thereby oxidizing the surface of the first oxidized silicon-rich nitride film 103, as shown in FIG. 11. As a result, a thin oxide film (not shown) is formed which serves to suppress the formation of scum during a subsequent photolithography process.

The condition of the process conducted using plasma in an in-situ fashion involves a reaction chamber pressure of 0.01 to 10 Torr, a radio-frequency application power of 0 to 5,000 KW, a substrate temperature of 100 to 500° C., and an electrode space of 10 to 1,000 mils. This process is carried out using $N_2O$ or $O_2$ gas in an amount of 100 to 10,000 sccm.

Thereafter, the first oxidized silicon-rich nitride film 103 and conductive layer 101 are patterned in accordance with a photolithography process using a conductive line mask (not shown), thereby forming patterns of the first oxidized silicon-rich nitride film 103 and conductive layer 101. Subsequently, a second oxidized silicon-rich nitride film (not shown) is deposited to a desired thickness over the entire upper surface of the resulting structure using a PECVD machine.

The deposition of the second oxidized silicon-rich nitride film (not shown) is carried out in accordance with a PECVD process using a radio frequency source of 13.56 MHz, or 100 Hz to 1 MHz.

The PECVD process is conducted at a pressure of 0.5 to 20 Torr while applying a substrate bias using a plasma generating power of 0 to 2 KW, in order to obtain an increased thin film density.

In this PECVD process, a gas mixture is used, which contains $SiH_4$ in an amount of 0 to 500 sccm, $N_2O$ in an amount of 0 to 5,000 sccm, and $N_2$ in an amount of 0 to 50,000 sccm.

Inert gas such as He, Ne, or Ar may also be added to the gas mixture. Where a deposition process is carried out using a gas mixture diluted by such inert gas, improvement in thin film uniformity is obtained.

The second oxidized silicon-rich nitride film (not shown) may also be formed in accordance with a PECVD process using a superhigh frequency source of 2.45 GHz.

This PECVD process is conducted at a pressure of 0.002 to 100 Torr while applying a substrate bias by the use of a plasma generating power of 0 to S KW in order to obtain an increased thin film density.

In the PECVD process, a gas mixture is used, which contains $SiH_4$ in an amount of 0 to 500 sccm, $N_2O$ in an amount of 0 to 5,000 sccm, and $N_2$ in an amount of 0 to 50,000 sccm.

Inert gas such as He, Ne, or Ar may also be added to the gas mixture. Where a deposition process is carried out using a gas mixture diluted by such inert gas, an improvement in thin film uniformity is obtained.

Thereafter, the second oxidized silicon-rich nitride film (not shown) is anisotropically etched, thereby forming spacers of the oxidized silicon-rich nitride film on the side walls of the conductive layer 101. Thus, the pattern of the conductive layer 101 is covered on its upper surface and side walls with a single-layer oxidized silicon-rich nitride film structure including the pattern of oxidized silicon-rich nitride film 103 and the oxidized silicon-rich nitride film spacers.

The following Table 3 describes results of optical characteristics measured using a spectroscopic ellipsometer for the oxidized silicon-rich nitride film 103 and oxidized silicon-rich nitride film spacers 105, respectively.

TABLE 3

| Film | $SiH_4:NH_4:N_2O$ (sccm) | $SiO_2$ (%) | $SiN_4$ (%) | Amorphous Si (%) | Wavelength (nm) | | | | | |
|---|---|---|---|---|---|---|---|---|---|---|
| | | | | | 633 | | 365 | | 248 | |
| | | | | | N | k | n | k | n | K |
| A | 70:200:120 | 36.69 | 50.78 | 9.53 | 1.954 | 0.009 | 2.066 | 0.085 | 2.168 | 0.323 |
| B | 80:350:50 | 31.29 | 57.84 | 10.87 | 2.033 | 0.011 | 2.16 | 0.108 | 2.245 | 0.398 |

"A" represents the oxidized silicon-rich nitride film pattern 103, "B" represents the oxidized silicon-rich nitride film spacer 105, "n" represents an index of refraction, and "k" represents an absorption constant.

Also, the following Table 4 describes characteristics, including dielectric constant, stress, and selectivity, exhibited by the SAC method using oxidized silicon-rich nitride films in accordance with the present invention along with a conventional SAC method using an oxidized nitride film and a conventional NB-SAC method, respectively.

TABLE 4

| SAC Process | Dielectric Constant | Stress | Selectivity |
|---|---|---|---|
| SAC Using Oxidized Silicon-Rich Nitride Film | 5~6 | 1E8~3E9 dyne/cm$^2$: Compressive to Tensile | 20~25 |
| SAC Using Oxidized Nitride Film | 5~6 | 1E8~3E9 dyne/cm$^2$: Compressive to Tensile | 5 |
| NB-SAC | 8 | ~3E9 dyne/cm$^2$: Tensile | 25 |

For reference, an insufficient step coverage resulting from the use of the PECVD method, as compared to that in the case using the LPCVD method, can be rather advantageously utilized upon forming spacers between patterns having a small width because those spacers are deposited to a small thickness on the upper surface and side walls of the conductive layer.

As apparent from the above description, the contact forming method according to the fourth embodiment of the present invention provides various effects.

That is, in accordance with this contact forming method, an increase in the etch selectivity of each oxidized silicon-rich nitride film to the interlayer insulating film is obtained by maintaining the content of amorphous silicon in the oxidized silicon-rich nitride film in a range of 5 to 30% while maintaining the content of Si—N in the mixture gas, used in the deposition of the oxidized silicon-rich nitride film, in a range of 30 to 70%. Therefore, it is possible to carry out an SAC process using a single-layer oxidized silicon-rich nitride film, in place of a conventional SAC process using a capping nitride film, while allowing the oxidized silicon-rich nitride film to conduct functions of an anti-reflection film, a hard mask, and spacers individually formed in accordance with a conventional multi-step deposition process.

Since the deposited film for the anti-reflection film or hard mask can have a reduced thickness, taking into consideration of the fact that when the oxidized silicon-rich nitride film has a thickness of 900 Å or more, the reflection factor of the film disposed beneath the oxidized silicon-rich nitride film can be controlled to be 10% or less, it is possible to reduce the topology affecting subsequent processes.

After the deposition thereof, the oxidized silicon-rich nitride film can be processed using plasma in an in-situ fashion. Accordingly, it is possible to reduce the number of processes required in processing the etch barrier film to a single process. Thus, the entire process is simplified.

Furthermore, a single-step etch process for the etch barrier film is used in accordance with the present invention because the etch barrier film is comprised of a single-layer oxidized silicon-rich nitride film, as compared to the conventional multi-step etch process in which two materials, that is, an oxidized silicon nitride film and a nitride film are etched. Accordingly, it is possible to improve efficiency of the process.

Since the hard mask and anti-reflection film are comprised of the oxidized silicon-rich nitride film, a bonding force therebetween increases, thereby achieving a stability in the formation of conductive lines for semiconductor devices.

Consequently, reduction in processing time and improvement in the process' efficiency and device characteristics are achieved.

Figure 13:
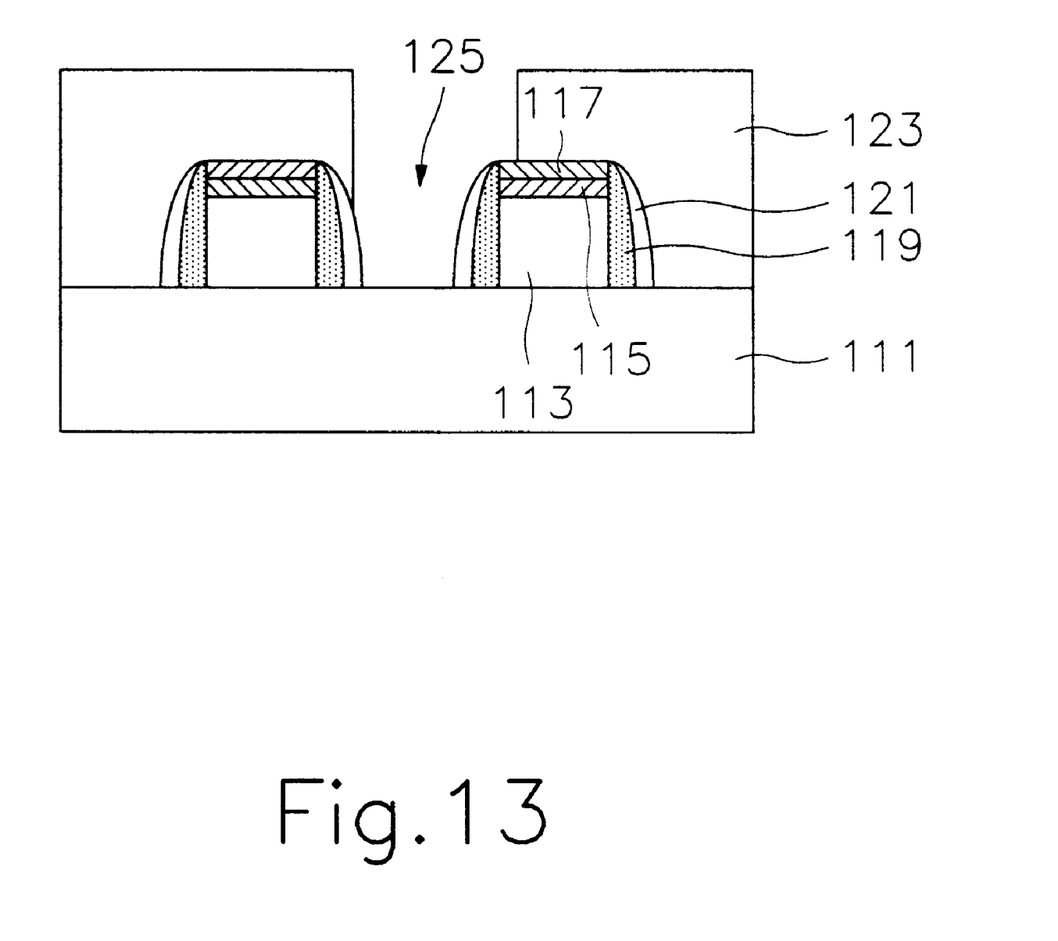
FIG. 13 is a cross-sectional view respectively illustrating a method for forming contacts of semiconductor devices in accordance with a fifth embodiment of the present invention.

FIG. 13 is a cross-sectional view respectively illustrating a method for forming contacts of semiconductor devices in accordance with a fifth embodiment of the present invention. Now, the contact forming method according to the fifth embodiment will be described in conjunction with FIGS. 13 and 14.

In accordance with this method, a conductive layer 113 for gate electrodes, a first oxidized silicon nitride film 115, and a first oxidized silicon-rich nitride film 117 are sequentially formed over a semiconductor substrate 111, as shown in FIG. 13.

The first oxidized silicon-rich nitride film 117 is comprised of an oxidized nitride film containing silicon in amount of 20 volume %.

The first oxidized nitride film 115 is comprised of a typical oxidized nitride film. The first oxidized silicon nitride film 115 and first oxidized silicon-rich nitride film 117 can be formed in an in-situ fashion by controlling a source gas for silicon supplied during a process for forming the first oxidized silicon-rich nitride film 117.

Thereafter, a photoresist film is coated over the upper surface of the laminated structure. The photoresist film is then patterned in accordance with a light exposure and development process using a gate electrode mask (not shown), thereby forming a pattern thereof.

Using the photoresist film pattern as a mask, the laminated structure is then etched, thereby forming gate electrodes on which a laminated structure including the first oxidized silicon nitride film 115 and first oxidized silicon-rich nitride film 117 is disposed.

Over the entire upper surface of the resulting structure, a second oxidized silicon nitride film (not shown) is then formed to have a desired thickness. The second oxidized silicon nitride film is anisotropically etched, thereby forming first insulating film spacers 119, comprised of the second oxidized silicon nitride film, on the side walls of the gate electrodes, respectively.

Then, a second oxidized silicon-rich nitride film (not shown) is formed to have a desired thickness. The second oxidized silicon-rich nitride film is anisotropically etched, thereby forming second insulating film spacers 121, comprised of the second oxidized silicon-rich nitride film, on the side walls of the first insulating film spacers 119, respectively.

The first and second oxidized silicon nitride films 115 and 119 may be replaced with corresponding oxide films, respectively.

Subsequently, an interlayer insulating film 123 is formed over the entire upper surface of the resulting structure in order to planarize the upper surface of the structure, as shown in FIG. 14. The interlayer insulating film 123 is made of an insulating material, exhibiting a fluidability, such as BPSG.

The interlayer insulating film 123 is then etched in a self-aligned fashion in accordance with an etch process using a contact mask for the formation of bit lines or storage electrodes, thereby forming contact holes 125 through which desired portions of the semiconductor substrate 111 are exposed.

The SAC process is conducted using C—F-based plasma, such as $C_4F_8/CH_2F_2$, capable of providing a sufficient etch selectivity difference between the interlayer insulating film 123 and each of the first and second oxidized silicon-rich nitride films 117 and 121.

In order to improve stability of the etch process, inert gas such as argon and helium may be additionally used in the etch process.

Alternatively, the etch process may be carried out using carbon-rich fluorine gas such as $C_3F_8$ or $C_5F_8$. In this case, C—H—F-based gas may be added to the carbon-rich fluorine gas in order to obtain a high etch selectivity while avoiding an etch stopping phenomenon.

Using the laminated structure of the oxidized silicon nitride film and oxidized silicon-rich nitride film, the mask insulating film and insulating film spacers for bit lines, in place of gate electrodes, may be formed in accordance with the present invention. In other words, the method of the present invention can be applied to a bit line contact process or a storage electrode contact process.

As apparent from the above description, the SAC method according to this embodiment provides various effects. That is, in accordance with this method, it is possible to form a mask insulating film and insulating film spacers using a laminated structure including a typical oxidized silicon nitride film and a typical oxidized silicon-rich nitride film or a laminated structure including a typical silicon oxide film and a typical oxidized silicon-rich nitride film. Accordingly, the SAC process can be easily conducted.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming contacts of a semiconductor device comprising the steps of:
   forming a conductive layer over a semiconductor substrate, and forming, over the conductive layer, a hard mask comprised of a first oxidized silicon-rich nitride film containing amorphous or polycrystalline silicon in amount of 5 to 70%;
   processing the first oxidized silicon-rich nitride film using plasma, thereby forming an oxide film over the first oxidized silicon-rich nitride film;
   patterning the hard mask and the conductive layer, thereby forming a hard mask pattern and conductive lines; and
   forming, on side walls of the hard mask pattern and side walls of the conductive lines, spacers comprised of a second oxidized silicon-rich nitride film containing amorphous or polycrystalline silicon in amount of 5 to 70%.

2. The method in accordance with claim 1, wherein the first oxidized silicon-rich nitride film is formed in accordance with an in-situ process so that it exhibits a low silicon content at a lower portion thereof and a high silicon content at an upper portion thereof.

3. The method in accordance with claim 2, wherein the first oxidized silicon-rich nitride film essentially consists of silicon nitride ($Si_3N_4$) and silicon oxide ($SiO_2$) along with the amorphous or polycrystalline silicon while having a silicon nitride ($Si_3N_4$) content ranging from 10% to 90%.

4. The method in accordance with claim 1, wherein the first and second oxidized silicon-rich nitride films are formed in accordance with a plasma enhanced chemical vapor deposition (PECVD) process using a radio frequency source of 13.56 MHz, or 100 Hz to 1 MHz.

5. The method in accordance with claim 4, wherein the PECVD process is conducted at a pressure of 0.5 to 20 Torr while applying a substrate bias by use of a plasma generating power of 0 to 2 KW to obtain an increased thin film density.

6. The method in accordance with claim 4, wherein the PECVD process uses a deposition gas mixture containing $SiH_4$ in amount of 0 to 500 sccm, $N_2O$ in amount of 0 to 5,000 sccm, and $N_2$ in amount of 0 to 50,000 sccm while being diluted by inert gas of He, Ne, or Ar.

7. The method in accordance with claim 1, wherein the first and second oxidized silicon-rich nitride films are formed in accordance with a plasma enhanced chemical vapor deposition (PECVD) process using a superhigh frequency source of 2.45 GHz.

8. The method in accordance with claim 7, wherein the PECVD process is conducted at a pressure of 0.002 to 100 Torr while applying a substrate bias by use of a plasma generating power of 0 to 5 KW to obtain an increased thin film density.

9. The method in accordance with claim 7, wherein the PECVD process uses a deposition gas mixture containing $SiH_4$ in amount of 0 to 500 sccm, $N_2O$ in amount of 0 to 5,000 sccm, and $N_2$ in amount of 0 to 50,000 sccm while being diluted by inert gas of He, Ne, or Ar.

10. The method in accordance with claim 1, wherein the step of processing the first oxidized silicon-rich nitride film using plasma is carried out in accordance with an in-situ process in a reaction chamber under the condition using a reaction chamber pressure of 0.1 to 10 Torr, a radio-frequency application power of 0 to 5,000 KW, a substrate temperature of 100 to 500° C., and an electrode space of 100 to 1,000 mils while using $N_2O$ or $O_2$ gas in amount of 100 to 10,000 sccm.

11. A method for forming contacts of a semiconductor device comprising the steps of:

sequentially laminating, over a semiconductor substrate, a conductive layer, a first oxidized silicon nitride film, and a first oxidized silicon-rich nitride film, and patterning them, thereby forming conductive lines;

forming, on side walls of the conductive lines, spacers each having a laminated structure including a second oxidized silicon nitride film and a second oxidized silicon-rich nitride film, respectively;

forming an interlayer insulating film over the entire upper surface of the resulting structure to planarize the upper surface of the resulting structure; and forming contact holes in a self-aligned fashion in accordance with a self-aligned contact etch process while exposing desired portions of the semiconductor substrate through the contact holes, respectively.

12. The method in accordance with claim 11, wherein the first and second oxidized silicon nitride films are formed in an in-situ fashion with respect to the first and second oxidized silicon-rich nitride films, respectively.

13. The method in accordance with claim 11, wherein the self-aligned contact etch process is conducted using C—F-based plasma capable of providing a sufficient etch selectivity difference between the interlayer insulating film and each of the first and second oxidized silicon-rich nitride film.

14. The method in accordance with claim 13, wherein the self-aligned contact etch process is conducted while additionally using inert gas of argon or helium to achieve an improvement in stability of the etch process.

15. The method in accordance with claim 11, wherein the self-aligned contact etch process is conducted using carbon-rich fluorine gas of $C_3F_8$ or $C_5F_8$.

16. The method in accordance with claim 13, wherein the self-aligned contact etch process is conducted while additionally using C—H—F-based gas to avoid an etch stopping phenomenon occurring due to a production of polymer.

17. The method in accordance with claim 11, wherein the first and second oxidized silicon nitride films are replaced with oxide films, respectively.

* * * * *